United States Patent
Suyama et al.

(10) Patent No.: US 9,892,892 B2
(45) Date of Patent: Feb. 13, 2018

(54) METHOD OF MANUFACTURING ELECTRON MULTIPLIER BODY, PHOTOMULTIPLIER TUBE, AND PHOTOMULTIPLIER

(71) Applicant: HAMAMATSU PHOTONICS K.K., Hamamatsu-shi, Shizuoka (JP)

(72) Inventors: Motohiro Suyama, Hamamatsu (JP); Hiroshi Kobayashi, Hamamatsu (JP); Shinya Hattori, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 155 days.

(21) Appl. No.: 15/057,144

(22) Filed: Mar. 1, 2016

(65) Prior Publication Data
US 2016/0260592 A1 Sep. 8, 2016

(30) Foreign Application Priority Data
Mar. 3, 2015 (JP) ................................ 2015-041555

(51) Int. Cl.
*H01J 43/10* (2006.01)
*H01J 9/12* (2006.01)
(Continued)

(52) U.S. Cl.
CPC ................ *H01J 43/10* (2013.01); *B32B 3/00* (2013.01); *B32B 9/005* (2013.01); *B32B 9/04* (2013.01); *C23C 14/00* (2013.01); *H01J 9/125* (2013.01); *H01J 43/16* (2013.01); *H01J 43/24* (2013.01); *B32B 2457/20* (2013.01)

(58) Field of Classification Search
CPC .... H01J 9/125; H01J 9/12; H01J 3/023; H01J 43/00; H01J 43/04; H01J 43/10; H01J 43/24; H01J 43/16; H01J 43/20; H01J 43/243; B32B 3/00
See application file for complete search history.

(56) References Cited

U.S. PATENT DOCUMENTS 3,244,922 A   4/1966   Wolfgang
3,374,380 A   3/1968   Goodrich
(Continued)

FOREIGN PATENT DOCUMENTS

JP    H05-144410 A   6/1993

*Primary Examiner* — Joseph L Williams
*Assistant Examiner* — Jose M Diaz
(74) *Attorney, Agent, or Firm* — Drinker Biddle & Reath LLP

(57) ABSTRACT

A method of manufacturing an electron multiplier body, the method includes a step of preparing a first plate-like member having a surface and a back surface and a pair of second plate-like members, a step of forming, in the first plate-like member, a hole portion reaching from the front surface to the back surface, a step of constituting a laminated body by laminating the first and second plate-like members on each other so that the first plate-like member is interposed between the pair of second plate-like members to form a channel defined by the hole portion in the laminated body, a step of integrating the laminated body, a step of constituting a main body portion by cutting the integrated laminated body so that the channel is open, and a step of forming a resistive layer and a secondary electron multiplication layer on an inner surface of the channel.

13 Claims, 17 Drawing Sheets

(51) Int. Cl.
*H01J 43/16* (2006.01)
*B32B 3/00* (2006.01)
*H01J 43/24* (2006.01)
*B32B 9/00* (2006.01)
*B32B 9/04* (2006.01)
*C23C 14/00* (2006.01)

(56) References Cited

U.S. PATENT DOCUMENTS

| | | | |
|---|---|---|---|
| 3,883,335 A * | 5/1975 | Polaert | C03B 23/0302 |
| | | | 65/105 |
| 4,757,229 A | 7/1988 | Schmidt et al. | |
| 5,367,218 A | 11/1994 | Comby | |
| 5,378,960 A * | 1/1995 | Tasker | H01J 9/12 |
| | | | 313/103 CM |
| 7,042,160 B2 | 5/2006 | Hosea et al. | |
| 9,514,920 B2 * | 12/2016 | Hattori | H01J 43/16 |

* cited by examiner

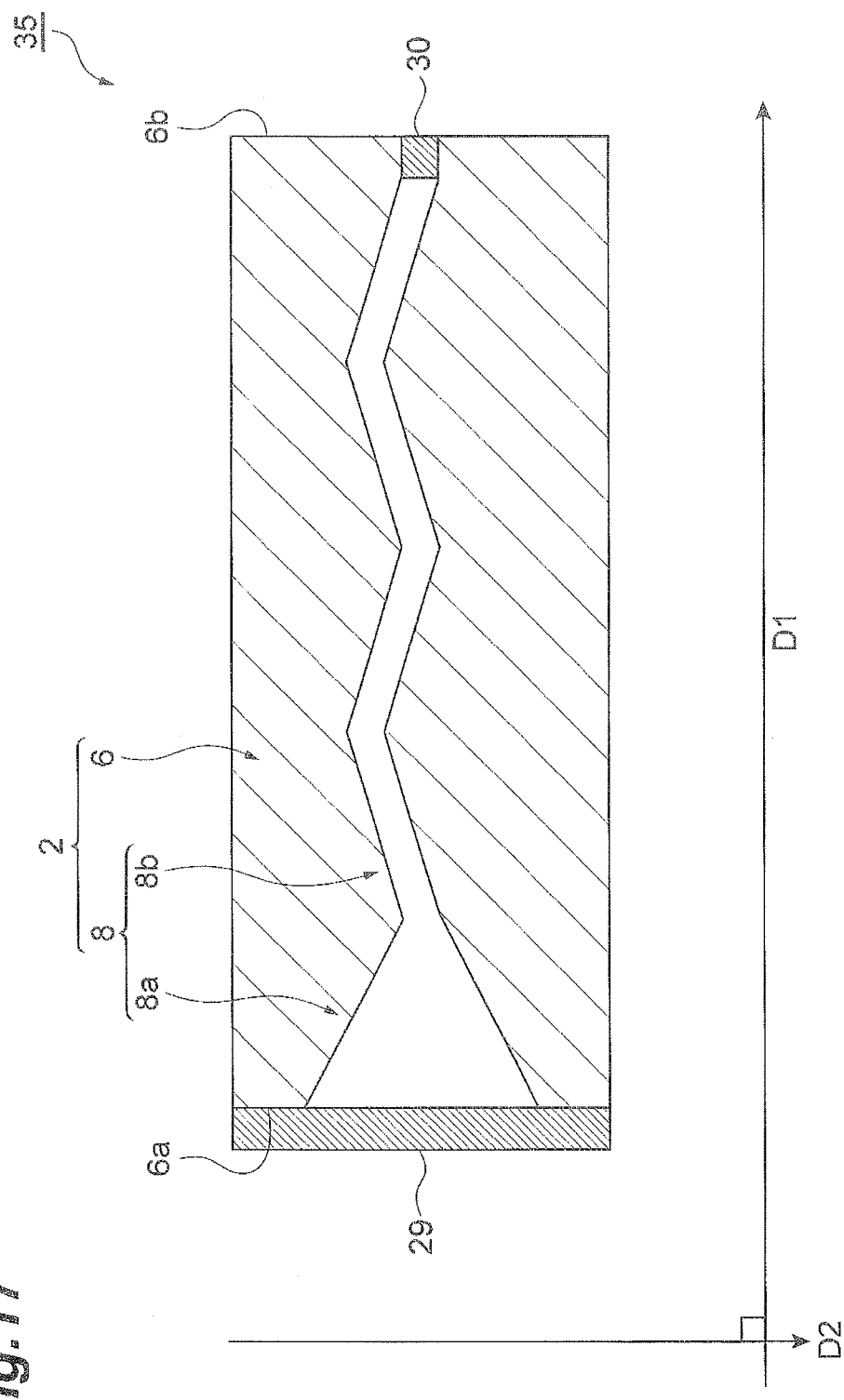

METHOD OF MANUFACTURING ELECTRON MULTIPLIER BODY, PHOTOMULTIPLIER TUBE, AND PHOTOMULTIPLIER

TECHNICAL FIELD

An aspect of the present invention relates to a method of manufacturing an electron multiplier body, a photomultiplier tube, and a photomultiplier.

BACKGROUND

An electron multiplier body including a rectangular parallelepiped dynode element in which a wavy passage is provided is described in Patent Document 1 (U.S. Pat. No. 3,244,922). In this electron multiplier body, two blocks having wavy groove portions formed therein are combined to form a passage and a dynode element.

SUMMARY

In the electron multiplier body described in Patent Document 1, the respective wavy groove portions are formed in the two blocks and combined to form the passage (a channel), as described above. However, in such a method, it is difficult to improve processability of the channel.

An aspect of the present invention has been made in view of such circumstances and an object of an aspect of the present invention is to provide a method of manufacturing an electron multiplier body, a photomultiplier tube, and a photomultiplier capable of improving processability of a channel.

A method of manufacturing an electron multiplier body according to an aspect of the present invention is a method of manufacturing an electron multiplier body including a main body portion extending in a first direction, and a channel opened at one end surface and the other end surface of the main body portion in the first direction and emits secondary electrons according to incident electrons, the method including: a preparing step of preparing a first plate-like member having a front surface and a back surface opposite to the front surface, and a pair of second plate-like members; a hole forming step of forming, in the first plate-like member, a hole portion reaching from the front surface to the back surface and extending along the front surface and the back surface; a laminating step of constituting a laminated body by laminating the first and second plate-like members on each other so that the first plate-like member is interposed between the pair of second plate-like members to form the channel defined by the hole portion in the laminated body; an integrating step of integrating the laminated body; a cutting step of constituting the main body portion by cutting the integrated laminated body; and a layer forming step of forming a resistive layer and a secondary electron multiplication layer on an inner surface of the channel, wherein in the cutting step, the laminated body is cut so that the channel is open at the one end surface and the other end surface.

In the method of manufacturing the electron multiplier body, the hole portion reaching from the front surface to the back surface and extending along the front surface and the back surface is formed in the first plate-like member. The first and second plate-like members are laminated on each other so that the first plate-like member is interposed between the pair of second plate-like members to constitute the laminated body and form the channel defined by the hole portion. The laminated body is integrated and cut to constitute the main body portion. Further, the resistive layer and the secondary electron multiplication layer are formed on the inner surface of the channel. According to this method, it is possible to improve the processability of the channel since it is relatively easy to form the hole portion in the plate-like member. Further, for the same reason, it is possible to reduce manufacturing cost.

In the method of manufacturing an electron multiplier body according to an aspect of the present invention, in the layer forming step, the resistive layer and the secondary electron multiplication layer may formed using an atomic layer deposition (ALD) method. In this case, it is possible to easily form the resistive layer and the secondary electron multiplication layer on an inner surface of the channel.

In the method of manufacturing an electron multiplier body according to an aspect of the present invention, the first and second plate-like members may be formed of a conductor, and the method may further include an insulating film forming step of forming an insulating film on a surface of the main body portion and the inner surface of the channel before the layer forming step. In this case, since a conductor can be used as the first and second plate-like members, it is possible to manufacture the electron multiplier body using a variety of materials.

In the method of manufacturing an electron multiplier body according to an aspect of the present invention, the hole portion may be formed to reach one end or the other end of the first plate-like member in the first direction in the hole forming step. In this case, before the cutting step, the hole portion reaches any one of the one and the other end of the first plate-like member. Therefore, in the cutting step, the channel can be open at the one end surface and the other end surface of the main body portion by simply cutting only the other of the one end and the other end of the first plate-like member. Further, before the cutting step, the hole portion does not reach the other of the one end and the other end of the first plate-like member. Therefore, it is possible to prevent the first plate-like member from being divided into two portions. Accordingly, it is possible to improve workability. Further, it is possible to make the width of the channel accurately and conveniently.

In the method of manufacturing an electron multiplier body according to an aspect of the present invention, in the hole forming step, the hole portion may be formed not to reach end portions of the first plate-like member. In this case, before the cutting step, the hole portion does not reach the end portions of the first plate-like member. Therefore, it is possible to more reliably prevent the first plate-like member from being divided into two portions. Accordingly, it is possible to improve the workability. Further, it is possible to make the width of the channel accurately and conveniently.

In the electron multiplier body according to an aspect of the present invention, the thickness of the first and second plate-like members may be 5 mm or less. In this case, since the first and second plate-like members are relatively thin, formation of the hole portion becomes easier. Therefore, it is possible to further improve the processability of the channel.

In the method of manufacturing an electron multiplier body according to an aspect of the present invention, a plurality of the first plate-like members may be prepared, and a third plate-like member may be further prepared in the preparing step, and in the laminating step, the first, second, and third plate-like members may be laminated on each other so that the third plate-like member is interposed between the first plate-like members and the first and third plate-like members are interposed between the pair of second plate-like members to constitute the laminated body. In this case, since the first plate-like member is interposed between the third plate-like member and each of the pair of second plate-like members, a plurality of channels are constituted in a laminating direction thereof. Therefore, it is possible to easily manufacture the electron multiplier body with multiple channels.

In the method of manufacturing an electron multiplier body according to an aspect of the present invention, a plurality of the hole portions may be formed in the first plate-like member in the hole forming step. In this case, a plurality of channels are formed in a direction along the front and back surfaces of the first plate-like member. Therefore, it is possible to easily manufacture the electron multiplier body with multiple channels.

A photomultiplier tube according to an aspect of the present invention is a photomultiplier tube including the electron multiplier body manufactured using the method of manufacturing an electron multiplier body; a tube body accommodating the electron multiplier body; a photocathode provided in the tube body to face an opening of the channel in the one end surface and configured to supply photoelectrons to the channel; and an anode arranged in the tube body to face an opening of the channel in the other end surface and configured to receive secondary electrons emitted from the channel according to the photoelectrons incident on the channel.

This photomultiplier tube includes an electron multiplier body manufactured using the above-mentioned method of manufacturing an electron multiplier body. Therefore, it is possible to achieve the operations and effects.

A photomultiplier according to an aspect of the present invention is a photomultiplier including the electron multiplier body manufactured using the method of manufacturing an electron multiplier body; a photocathode provided to close an opening of the channel at the one end surface and configured to supply photoelectrons to the channel; and an anode provided to close an opening of the channel in the other end surface and configured to receive secondary electrons emitted from the channel according to the photoelectrons incident on the channel.

This photomultiplier includes an electron multiplier body manufactured using the above-mentioned method of manufacturing an electron multiplier body. Therefore, it is possible to achieve the operations and effects.

According to an aspect of the present invention, it is possible to improve the processability of the channel.

BRIEF DESCRIPTION OF THE DRAWINGS

FIG. 17 is a cross-sectional view of a photomultiplier to which the electron multiplier body illustrated in FIG. 2 is applied.

DETAILED DESCRIPTION

Hereinafter, an embodiment of an aspect of the present invention will be described in detail with reference to the drawings. The same or corresponding portions in the respective drawings are denoted with the same reference signs, and repeated description is omitted.

Figure 1:
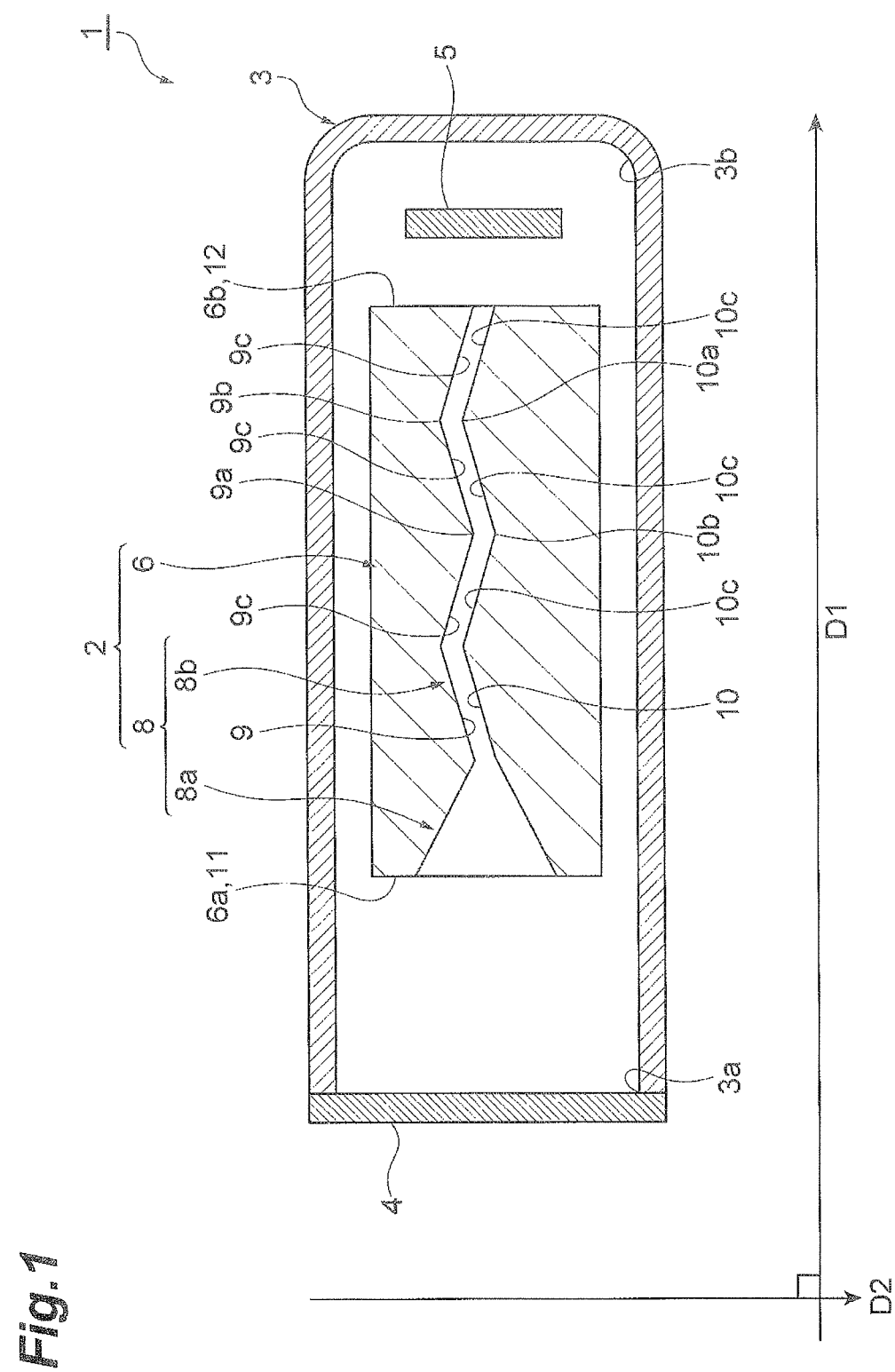
FIG. 1 is a cross-sectional view of a photomultiplier tube according to an embodiment.
Figure 2:
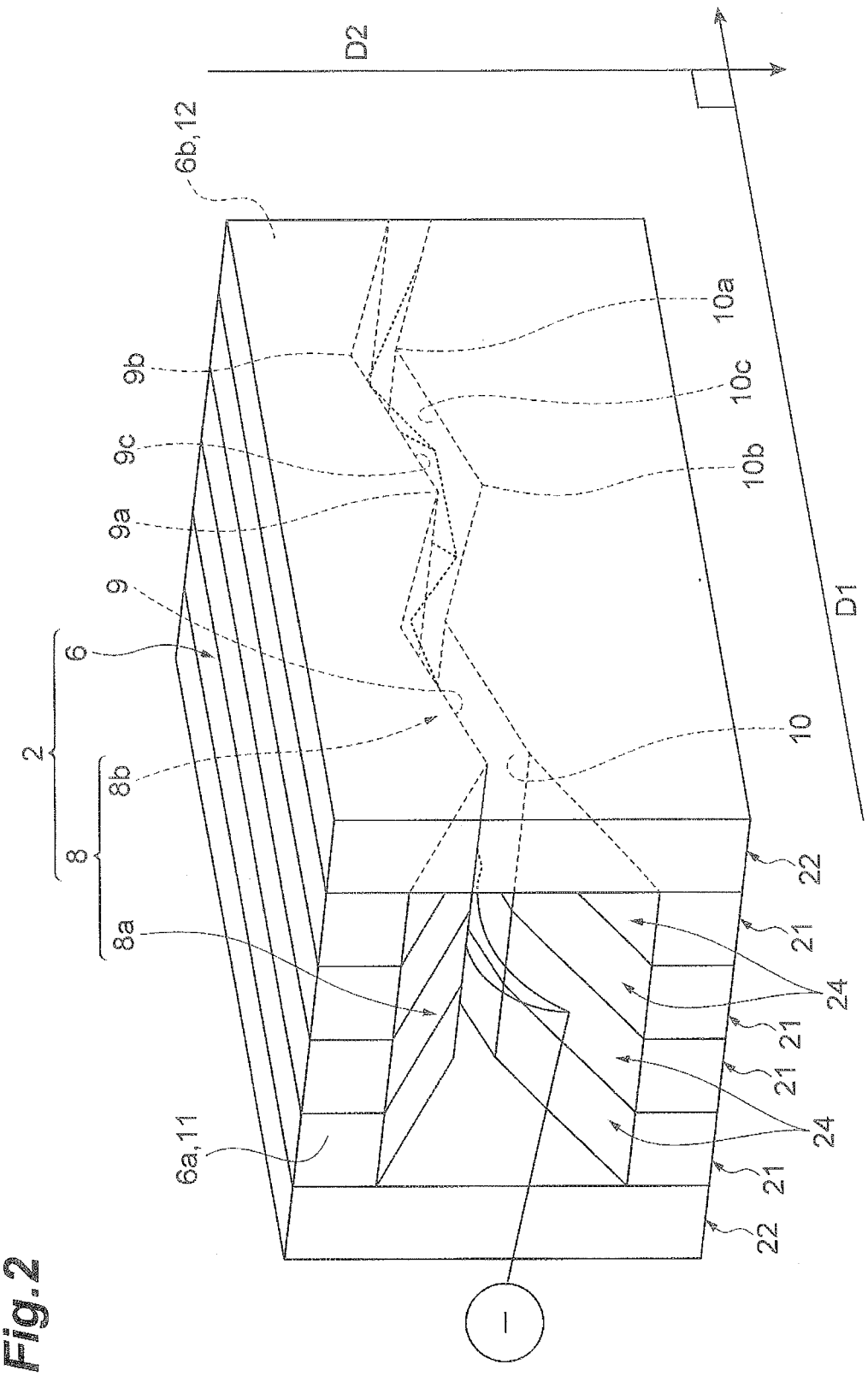
FIG. 2 is a perspective view of an electron multiplier body according to the embodiment.

FIG. 1 is a cross-sectional view of a photomultiplier according to the embodiment, and FIG. 2 is a perspective view of an electron multiplier body according to the embodiment. As illustrated in FIGS. 1 and 2, a photomultiplier tube 1 includes an electron multiplier body 2, a tube body 3, a photocathode 4, and an anode 5. The electron multiplier body 2 multiplies electrons by emitting secondary electrons according to the incidence of electrons. The electron multiplier body 2 includes a main body portion 6, and a channel 8.

The main body portion 6 extends in a first direction D1. Further, the main body portion 6 is formed in a rectangular parallelepiped shape. The main body portion 6 includes one end surface 6a and the other end surface 6b in the first direction D1. At least a surface of the main body portion 6 is formed of an insulator. Here, for example, the main body portion 6 is formed of a ceramic which is an insulator.

The channel 8 emits secondary electrons according to incident electrons. The channel 8 includes an electron incidence portion 8a and a multiplier portion 8b. The electron incidence portion 8a is an inlet portion for causing electrons to be incident from the outside of the main body portion 6 to the inside of the main body portion 6. The electron incidence portion 8a is provided in the main body portion 6 to be open at the one end surface 6a of the main body portion 6 in the first direction D1. An opening of the electron incidence portion 8a at the one end surface 6a exhibits a rectangular shape when viewed from the first direction D1. Further, the electron incidence portion 8a is gradually narrowed in a second direction D2 to be described later along the first direction D1. That is, the electron incidence portion 8a exhibits a tapered shape reduced along the first direction D1.

The multiplier portion 8b emits the secondary electrons according to the electrons incident from the electron incidence portion 8a. The multiplier portion 8b is open at the other end surface 6b of the main body portion 6 in the first direction D1. An opening of the multiplier portion 8b at the other end surface 6b faces the anode 5. The multiplier portion 8b is provided in the main body portion 6 to reach the electron incidence portion 8a. Therefore, the channel 8, as a whole, is open at the one end surface 6a and the other end surface 6b of the main body portion 6.

The multiplier portion 8b includes a first inner surface 9 and a second inner surface 10 extending over the entire multiplier portion 8b in the first direction D1 and facing each other. The first inner surface 9 and the second inner surface 10 are spaced in the second direction D2 intersecting the first direction D1. The second direction D2 is a direction from the first inner surface 9 to the second inner surface 10. Here, the second direction D2 is a direction perpendicular to the first direction D1.

The first inner surface 9 includes a first convex bent portion 9a and a second concave bent portion 9b which are arranged alternately along the first direction D1. Further, the first inner surface 9 includes a plurality of first inclined surfaces 9c defining each of the first bent portion 9a and the second bent portion 9b. The first inclined surface 9c has a planar shape. In this embodiment, the first bent portion 9a and the second bent portion 9b are bent in an angular shape.

The second inner surface 10 includes a third convex bent portion 10a and a fourth concave bent portion 10b which are arranged alternately along the first direction D1. Further, the second inner surface 10 includes a plurality of second inclined surfaces 10c defining each of the third bent portion 10a and the fourth bent portion 10b. The second inclined surface 10c has a planar shape. In this embodiment, the third bent portion 10a and the fourth bent portion 10b are bent in an angular shape.

That is, the first inner surface 9 and the second inner surface 10 are formed to be repeatedly bent in a zigzag shape (for example, a wavy shape) along the first direction D1. Here, in the first inner surface 9 and the second inner surface 10, the first bent portion 9a and the fourth bent portion 10b face each other, the second bent portion 9b and the third bent portion 10a face each other, and the first inclined surface 9c and the second inclined surfaces 10c face each other in the second direction D2.

A resistive layer and a secondary electron multiplication layer are provided to be laminated on each other on the inner surface of the electron incidence portion 8a and the inner surface (at least the first inner surface 9 and the second inner surface 10) of the multiplier portion 8b. The surface of the electron incidence portion 8a and the surface of the multiplier portion 8b form the secondary electron multiplication layer. For example, a mixed film of aluminum oxide ($Al_2O_3$) and zinc oxide (ZnO), a mixed film of $Al_2O_3$ and titanium dioxide ($TiO_2$), or the like can be used as a material of the resistive layer. For example, $Al_2O_3$, magnesium oxide (MgO), or the like can be used as material of the secondary electron multiplication layer.

Further, metal layers 11 and 12 containing a nickel-based metal are provided on the one end surface 6a and the other end surface 6b of the main body portion 6 using a method such as vapor deposition, respectively. A potential difference is given to the main body portion 6 so that the metal layer 12 provided on the other end surface 6b has a higher potential than that of the metal layer 11 provided on the one end surface 6a. By the potential difference being given in this way, a potential difference in the first direction D1 is generated in the channel 8.

The main body portion 6 is configured by laminating first and second plate-like members 21 and 22 on each other so that a plurality of (here, four) first plate-like members 21 are interposed between a pair of second plate-like members 22, as will be described later. Accordingly, hole portions 24 formed in each of the first plate-like members 21 are connected to each other, and both ends thereof in a laminating direction are closed by the second plate-like members so that the channel 8 is configured.

The tube body 3 accommodates the electron multiplier body 2. As illustrated in FIG. 1, the tube body 3 extends in the first direction D1. In the first direction D1, one end 3a of the tube body 3 is open and the other end 3b is sealed. Here, the one end surface 6a of the main body portion 6 of the electron multiplier body 2 is located at the one end 3a of the tube body 3, and the other end surface 6b of the main body portion 6 of the electron multiplier body 2 is located at the other end 3b of the tube body 3.

The photocathode 4 generates photoelectrons according to the incidence of light. The photocathode 4 has a flat plate shape. The photocathode 4 is provided to close the opening at the one end 3a of the tube body 3. The photocathode 4 faces the opening of the electron incidence portion 8a at the one end surface 6a of the main body portion 6 of the electron multiplier body 2. Accordingly, the photoelectrons generated in the photocathode 4 are supplied to the electron incidence portion 8a. In a state in which the opening at the one end 3a of the tube body 3 is closed by the photocathode 4, the inside of the tube body 3 is reduced in pressure.

The anode 5 receives the secondary electrons which are emitted from the channel 8 according to the photoelectrons incident on the channel 8. The anode 5 has a flat plate shape. The anode 5 is arranged within the tube body 3 to face the opening of the multiplier portion 8b at the other end surface 6b of the main body portion 6. The anode 5 is arranged to be spaced from the other end surface 6b of the main body portion 6 and the other end 3b of the tube body 3. A detector (not illustrated) that detects pulses of an electrical signal corresponding to the secondary electrons received by the anode 5 is connected to the anode 5.

Figure 3A:
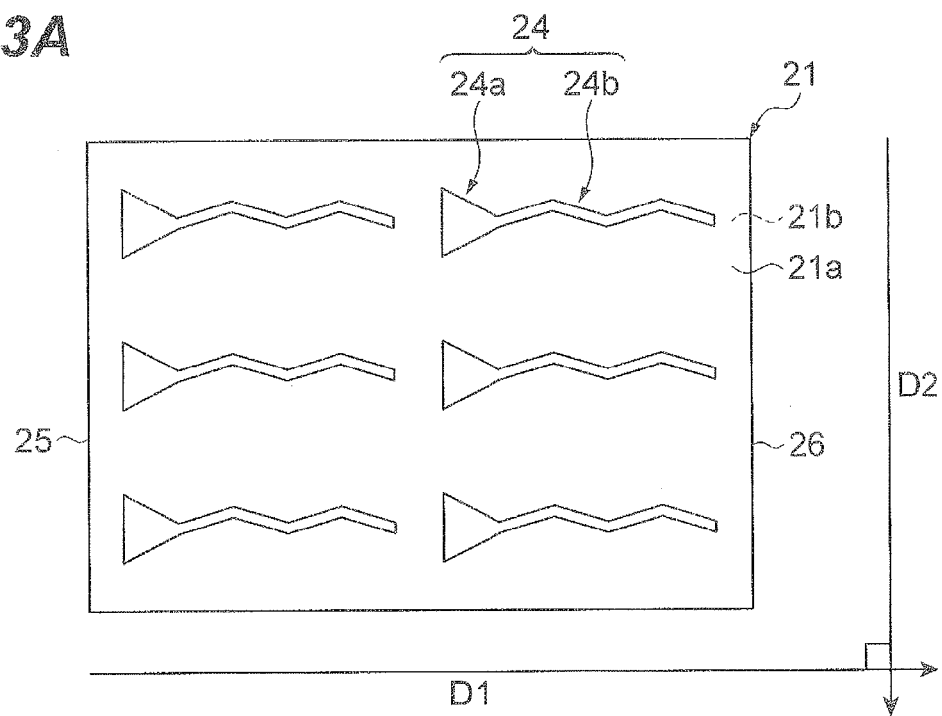
FIGS. 3A and 3B are views illustrating a step of a method of manufacturing an electron multiplier body according to the embodiment.
Figure 3B:
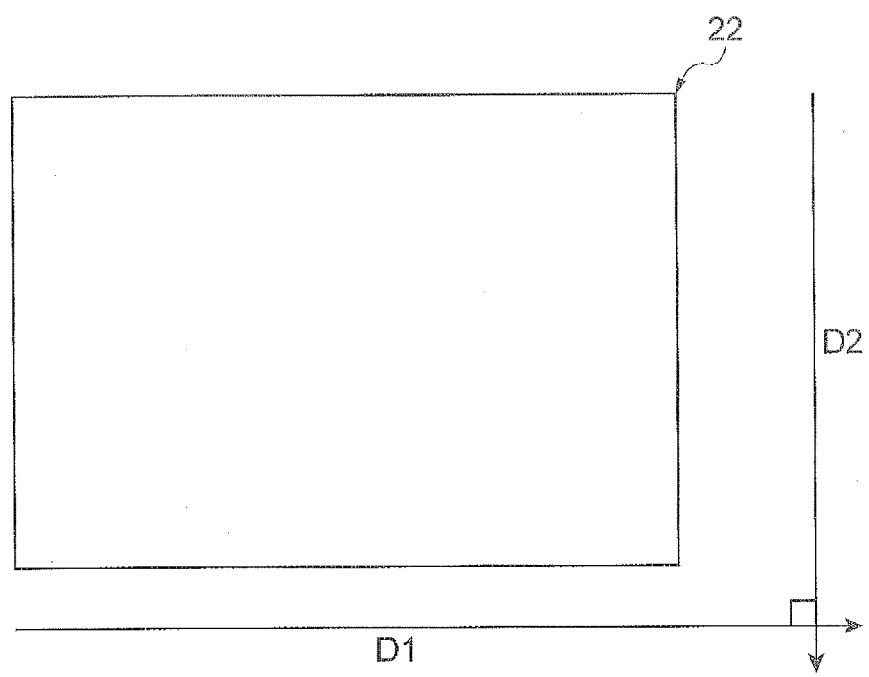

Subsequently, a method of manufacturing the electron multiplier body 2 as described above will be described. In this manufacturing method, as illustrated in FIGS. 3A and 3B, a plurality of (here four) first plate-like members 21 including a surface 21a and a back surface 21b opposite to the surface 21a, and a pair of second plate-like members 22 are first prepared (a preparing step). Here, hole portions 24, which will be described later, are not formed in the first plate-like members 21. The first and second plate-like members 21 and 22 exhibit a rectangular shape. Further, a thickness of each of the first and second plate-like members 21 and 22 is 5 mm or less. The first and second plate-like members 21 and 22 are formed of a ceramic which is an insulator. Here, since the first and second plate-like members 21 and 22 are formed of the ceramic, the first and second plate-like members 21 and 22 can be formed to be relatively thin by performing a laminating step through roll compaction.

In a subsequent step, a plurality of (here six) hole portions 24 are formed in the first plate-like member 21 (a hole forming step). The hole portion 24 can be formed by, for example, laser machining, punching using a mold, or the like. The hole portions 24 reach from the surface 21a to the back surface 21b, and extend along the surface 21a and the back surface 21b. The hole portions 24 are arranged two-dimensionally in the first direction D1 and the second direction D2.

The hole portions 24 extend in the first direction D1. Specifically, the hole portion 24 includes a triangular portion 24a formed in a triangular shape spread in a direction opposite to the first direction D1, and an extending portion 24b extending in the first direction D1 from the triangular portion 24a. However, the hole portion 24 is formed not to reach end portions of the first plate-like member 21 (particularly, one end 25 and the other end 26 in the first direction D1).

Figure 4:
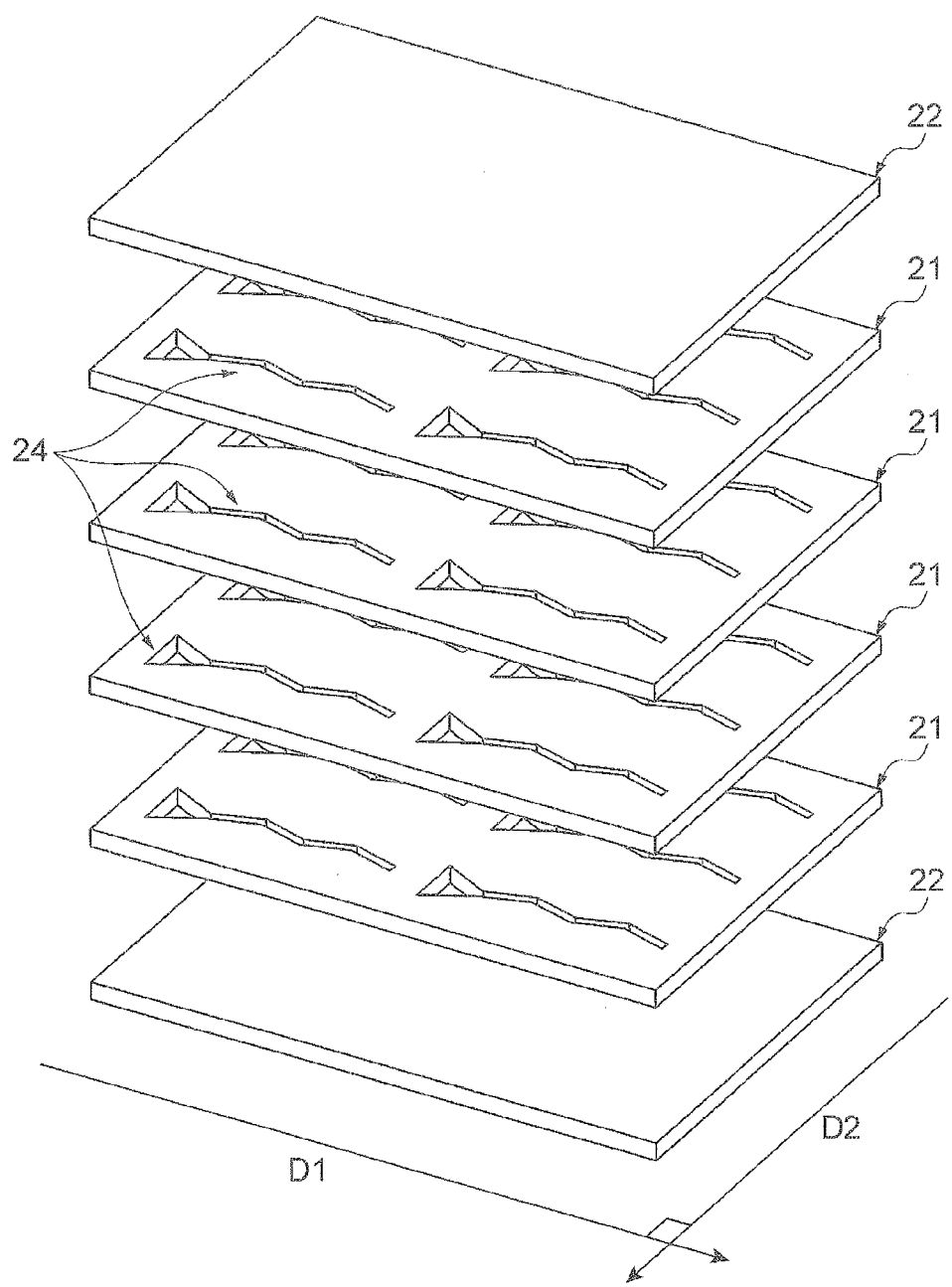
FIG. 4 is a view illustrating a step of the method of manufacturing an electron multiplier body according to the embodiment.
Figure 5:
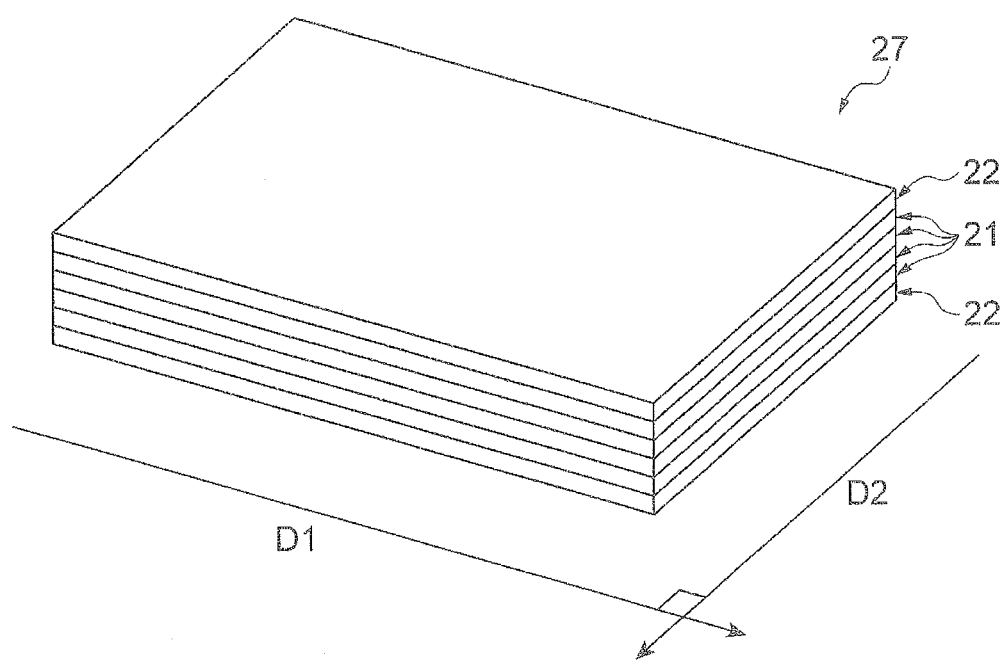
FIG. 5 is a view illustrating a step of the method of manufacturing an electron multiplier body according to the embodiment.

In a subsequent step, as illustrated in FIGS. 4 and 5, the first and second plate-like members 21 and 22 are laminated on each other so that the first plate-like members 21 are interposed between the pair of second plate-like members 22 and a laminated body 27 is formed (a laminating step). Here, the four first plate-like members 21 are interposed between the pair of second plate-like members 22. By laminating the first and second plate-like members 21 and 22 on each other in this way, a plurality of channels 8 defined by the hole portions 24 are formed in the laminated body 27. Here, the triangular portions 24a of the hole portions 24 constitute the electron incidence portion 8a, and the extending portions 24b constitute the multiplier portion 8b (see FIG. 7). By adjusting the number of first plate-like members 21 to be laminated, it is possible to adjust a width of the channel 8 in the laminating direction of the plate-like members.

In a subsequent step, the laminated body 27 is integrated (an integration step). Here, the first and second plate-like members 21 and 22 formed of a ceramic are pressed and sintered to be integrated.

Figure 6:
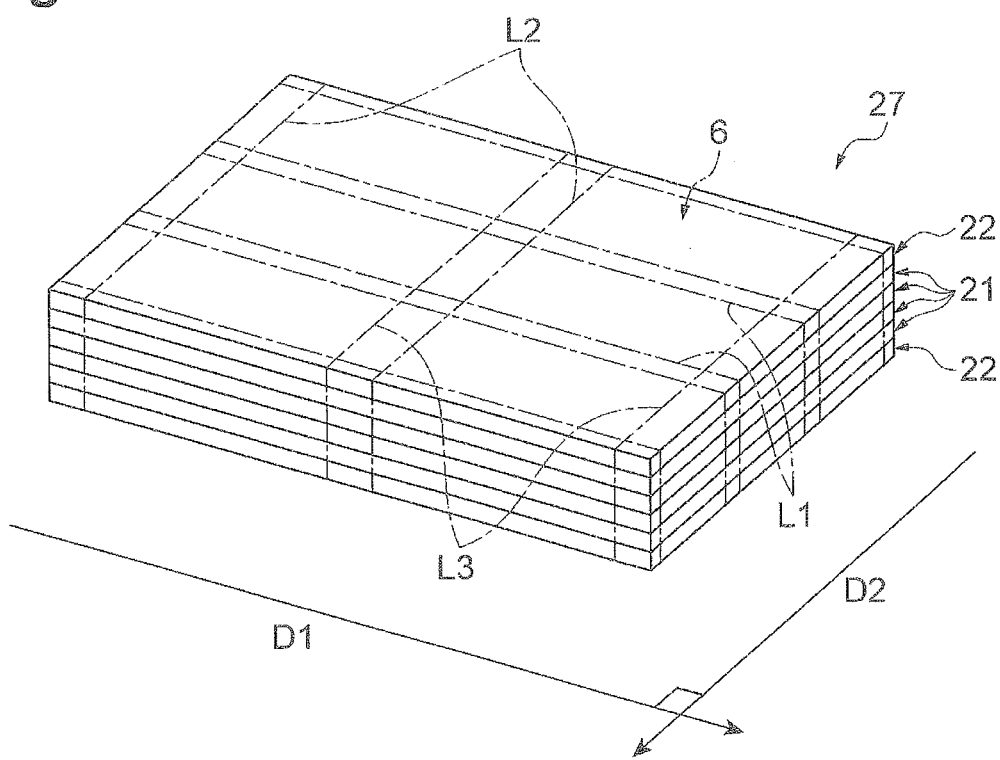
FIG. 6 is a view illustrating a step of the method of manufacturing an electron multiplier body according to the embodiment.
Figure 7:
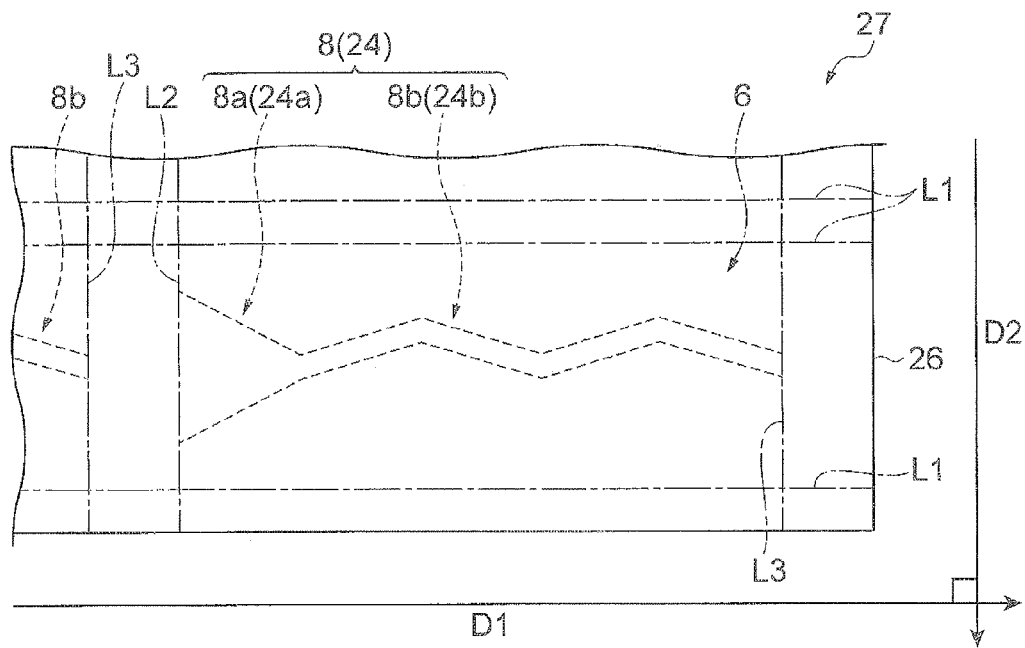
FIG. 7 is a view illustrating a step of the method of manufacturing the electron multiplier body according to the embodiment.

In a subsequent step, the integrated laminated body 27 is cut to constitute the main body portion 6 (a cutting step), as illustrated in FIGS. 6 and 7. In this cutting step, the laminated body 27 is cult along virtual cutting lines L1, L2, and L3 set in the laminated body 27. The cutting lines L1, L2, and L3 are set in a grid pattern so that channels 8 two-dimensionally arranged in the first direction D1 and the second direction D2 are carved one by one. The cutting line L1 is set along the first direction D1. The cutting line L1 defines a width of the main body portion 6 which is along the second direction D2. Each of the cutting lines L2 and L3 are set along the second direction D2. The cutting lines L2 and L3 define a length of the main body portion 6 which is along the first direction D1. The cutting line L2 is set so that the electron incidence portion 8a is open at a cut surface when cutting is performed along the cutting line L2. Further, the cutting line L3 is set so that the multiplier portion 8b is open at a cut surface when cutting is performed along the cutting line L3. By cutting the laminated body 27 along the cutting lines L1, L2, and L3 as described above, a plurality of main body portions 6 each including a single channel 8 are constituted.

Figure 8:
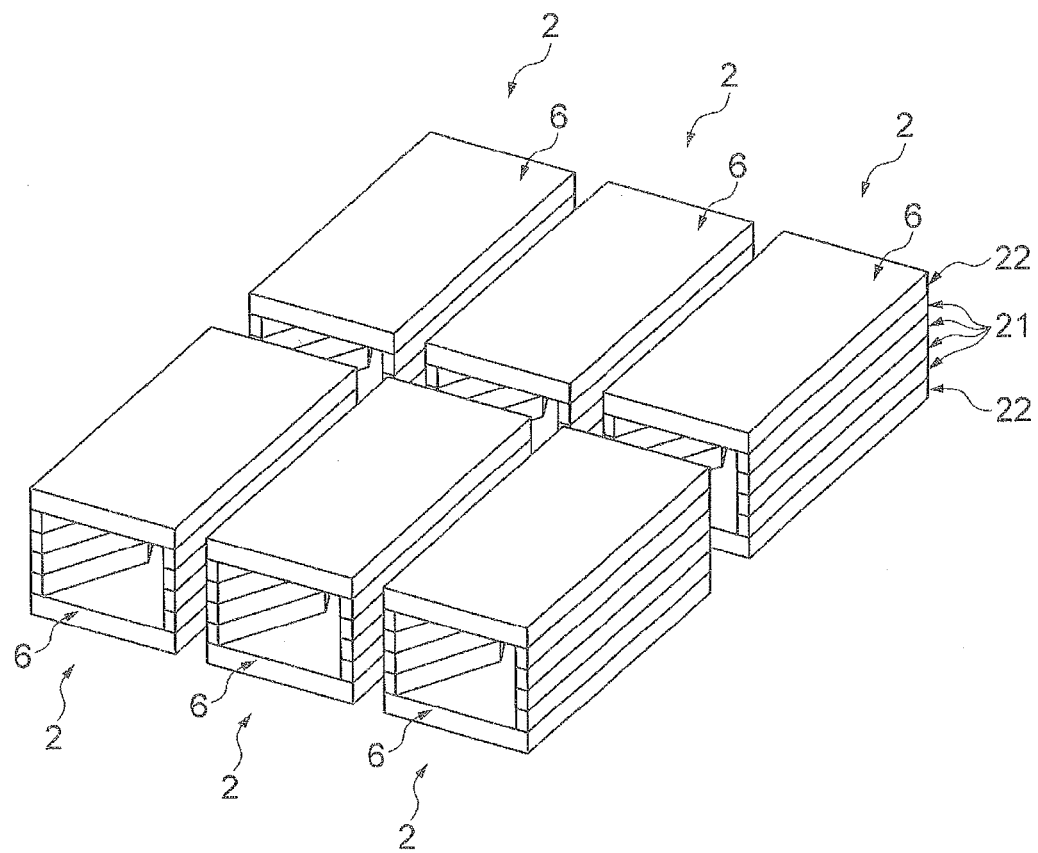
FIG. 8 is a view illustrating a step of the method of manufacturing an electron multiplier body according to the embodiment.

In a subsequent step, a resistive layer and a secondary electron multiplication layer are formed on the inner surface of the channel 8 formed in the main body portion 6 (a layer forming step). Here, the resistive layer and the secondary electron multiplication layer are formed using an atomic layer deposition method. Through the above steps, a plurality of electron multiplier bodies 2 as illustrated in FIG. 8 are manufactured.

As described above, in the method of manufacturing the electron multiplier body 2 according to the embodiment, the hole portion 24 reaching from the surface 21a to the back surface 21b and extending along the surface 21a and the back surface 21b is formed in the first plate-like members 21. The first plate-like members 21 and the pair of second plate-like members 22 are laminated on each other so that the first plate-like members 21 are interposed between the pair of second plate-like members 22 to constitute the laminated body 27 and form the channel 8 defined by the hole portion 24. This laminated body 27 is integrated and cut to constitute the main body portion 6. Further, the resistance layer and the secondary electron multiplication layer are formed on the inner surface of the channel 8. According to this method, it is possible to improve the processability of the channel 8 since it is relatively easy to form the hole portion 24 in the plate-like member. Further, for the same reason, it is possible to reduce manufacturing cost.

Further, in the method of manufacturing the electron multiplier body 2, the resistive layer and the secondary electron multiplication layer are formed using an atomic layer deposition method in the layer forming step. Accordingly, it is possible to easily form the resistive layer and the secondary electron multiplication layer on the inner surface of the channel 8.

Further, in the method of manufacturing the electron multiplier body 2, the hole portion 24 is formed not to reach the end portions of the first plate-like member 21 in the hole forming step. Accordingly, before the cutting step, the hole portion 24 does not reach the end portion of the first plate-like member 21. Therefore, it is possible to more reliably prevent the first plate-like member 21 from being divided into two portions. Accordingly, it is possible to improve workability. Further, it is possible to make the width of the channel 8 accurately and conveniently.

Further, in the electron multiplier body 2, a thickness of the first and second plate-like members 21 and 22 is 5 mm or less. Accordingly, since the first and second plate-like members 21 and 22 are relatively thin, the formation of the hole portion 24 becomes easier. Therefore, it is possible to further improve the processability of the channel 8.

In the photomultiplier tube 1 according to the embodiment, since the electron multiplier body 2 manufactured using the above-described method of manufacturing the electron multiplier body 2 is included, it is possible to suitably achieve the operations and effects.

First Modification Example

Figure 9A:
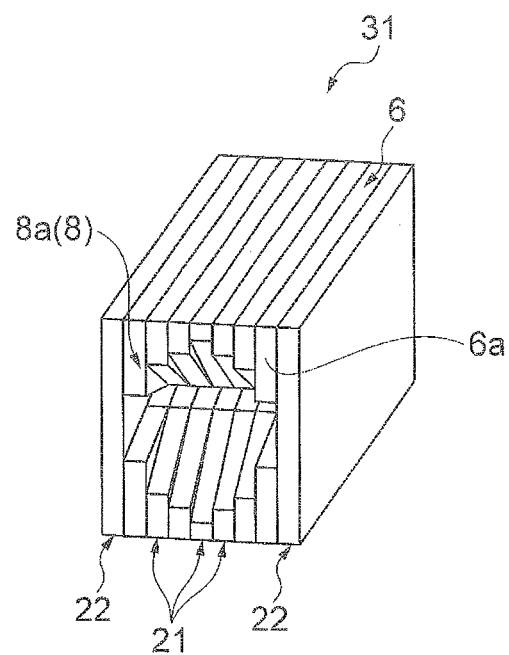
FIGS. 9A and 9B are views illustrating an electron multiplier body manufactured using a method of manufacturing an electron multiplier body according to a first modification example.

Next, a method of manufacturing an electron multiplier body according to the first modification example will be described. As illustrated in FIG. 9A, an electron multiplier body 31 according to the first modification example includes an electron incidence portion 8a exhibiting a funnel shape. That is, an opening of the electron incidence portion 8a at one end surface 6a of a main body portion 6 is wider at a central portion in a laminating direction of plate-like members and narrower at portions closer to both end portions thereof.

Figure 9B:
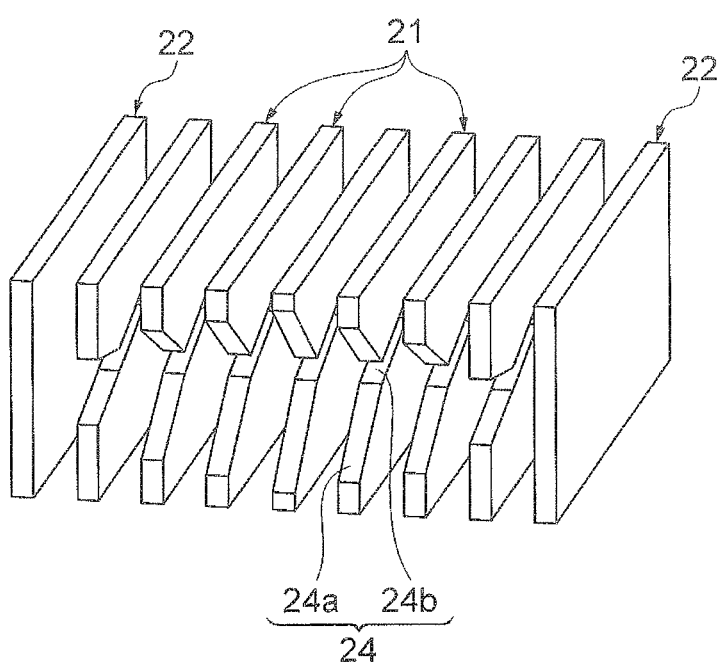

As illustrated in FIG. 9B, in order to constitute the electron incidence portion 8a as described above, in the method of manufacturing the electron multiplier body 31, hole portions 24 of which spread angles of triangular portions 24a are different from each other are formed in each first plate-like member 21 in a hole forming step. In a laminating step, the plurality of first plate-like members 21 are laminated so that the electron incidence portion 8a exhibits the funnel shape described above. By performing such a step, it is possible to easily form the channel 8 having the shape as described above.

Second Modification Example

Figure 10A:
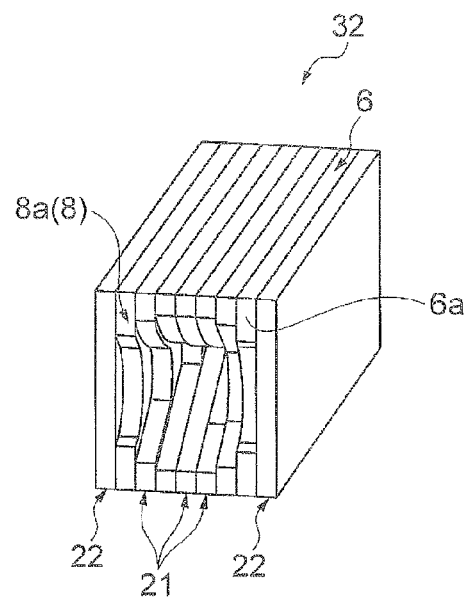
FIGS. 10A and 10B are views illustrating an electron multiplier body manufactured using a method of manufacturing an electron multiplier body according to a second modification example.
Figure 10B:
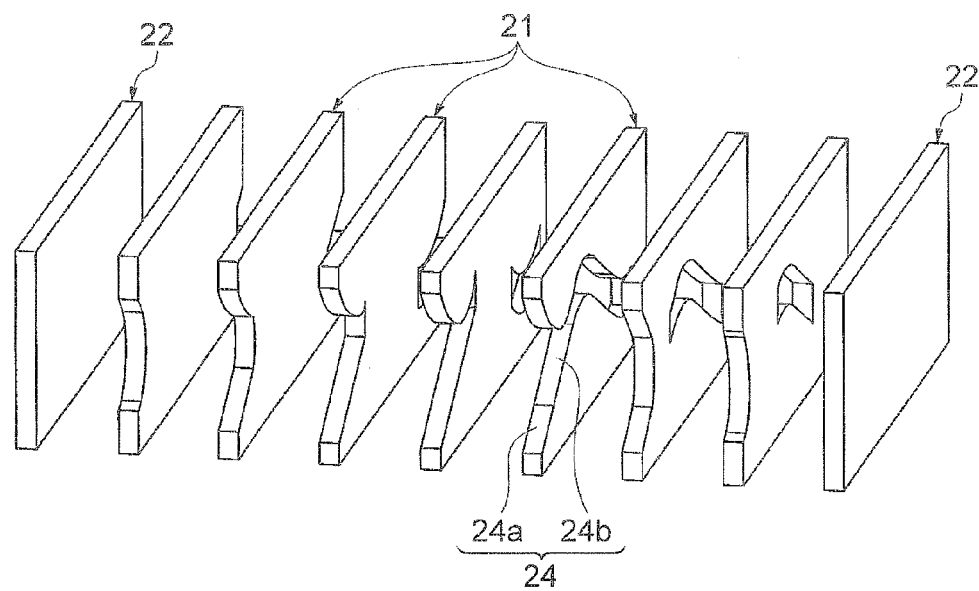

Next, a method of manufacturing an electron multiplier body according to the second modification example will be described. As illustrated in FIGS. 10A and 10B, an electron multiplier body 32 according to the second modification example includes a channel 8 exhibiting a three-dimensionally bent shape (for example, a helical shape). In the method of manufacturing the electron multiplier body 32, hole portions 24 of which shapes of triangular portions 24a and extending portions 24b are different from each other are formed in each plate-like member 21 in a hole forming step. In a laminating step, the plurality of first plate-like members 21 are laminated so that the channel 8 exhibits a three-dimensionally bent shape. By performing such steps, it is possible to easily form the channel 8 having the shape as described above.

Third Modification Example

Figure 11:
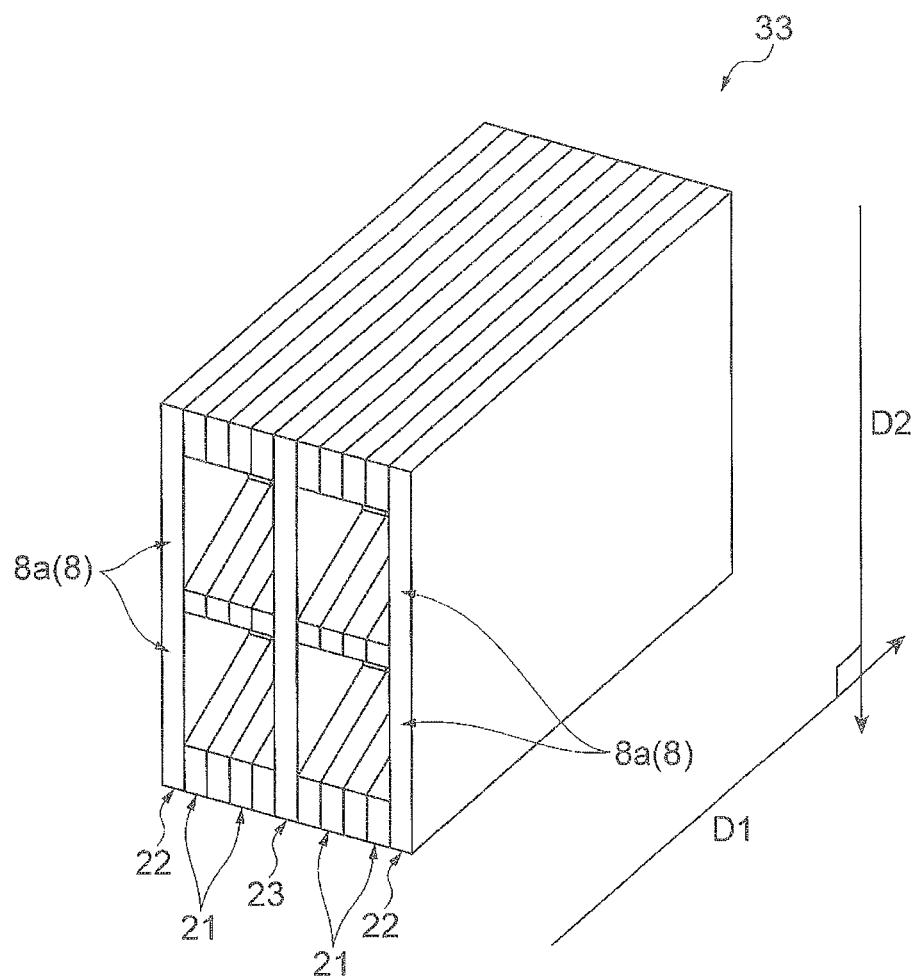
FIG. 11 is a view illustrating an electron multiplier body manufactured using a method of manufacturing an electron multiplier body according to a third modification example.

Next, a method of manufacturing an electron multiplier body 33 will be described. As illustrated in FIG. 11, the electron multiplier body 33 according to the third modification example includes a plurality of channels 8 arranged two-dimensionally along a laminating direction of plate-like members and a second direction D2. That is, the electron multiplier body 33 is an electron multiplier body 33 with multiple channels. In the method of manufacturing the electron multiplier body 33, a plurality of first plate-like members 21, a pair of second plate-like members 22, and a third plate-like member 23 are first prepared (a preparation step). A shape, a material, and the like of the third plate-like member 23 may be the same as those of the first and second plate-like members 21 and 22.

Figure 12A:
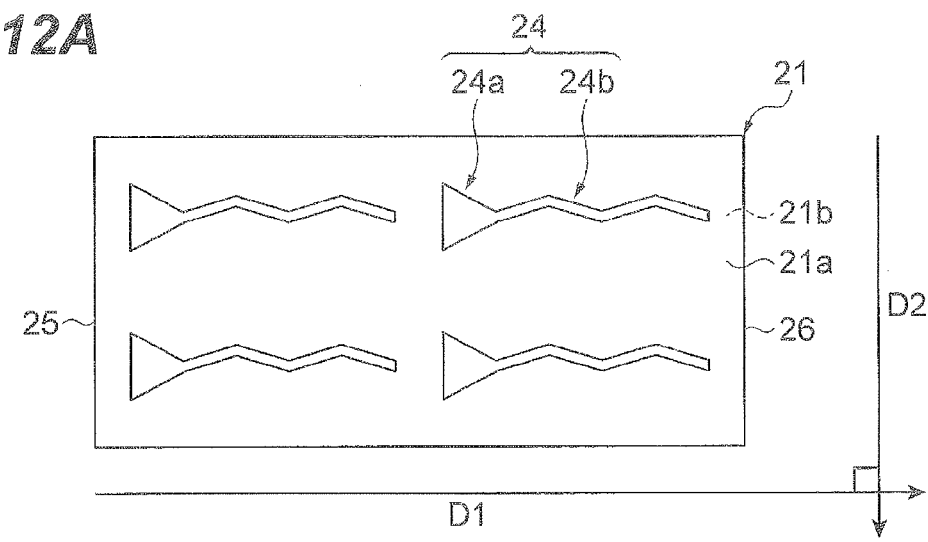
FIGS. 12A to 12C are views illustrating a step of the method of manufacturing an electron multiplier body according to the third modification example.
Figure 12B:
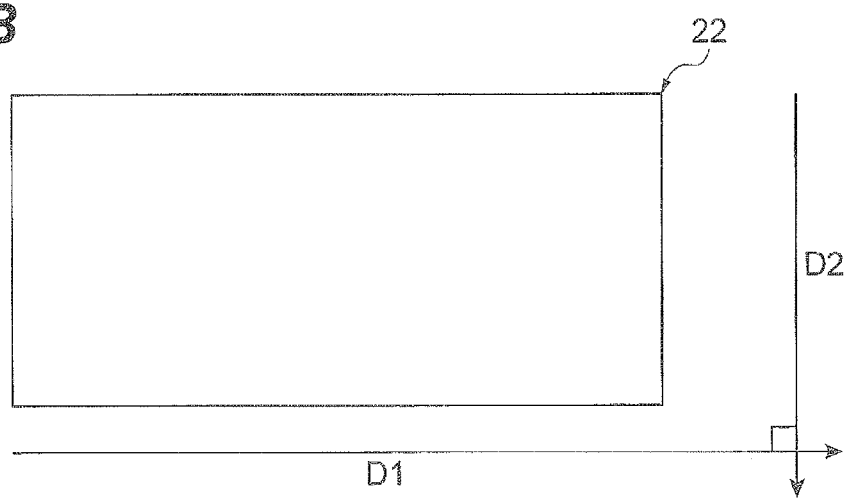
Figure 12C:
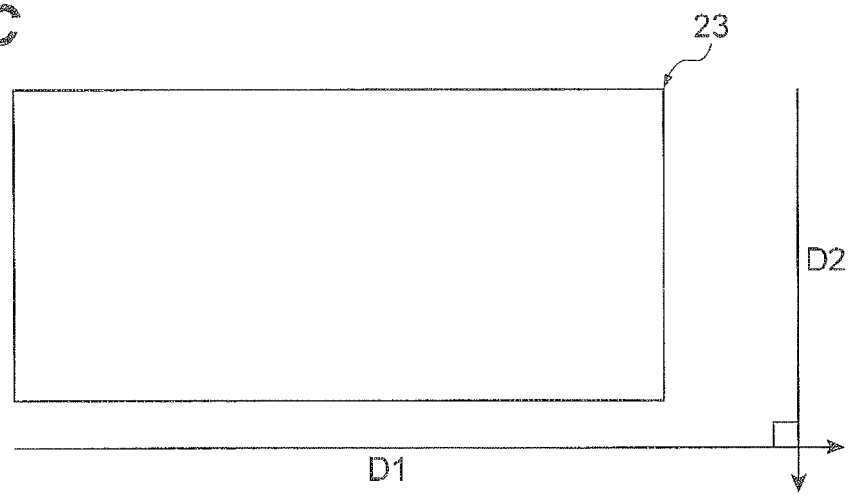

In a subsequent step, as illustrated in FIGS. 12A to 12C, a plurality of hole portions 24 are formed in the first plate-like members 21 (a hole forming step). Here, the hole portions 24 are arranged two-dimensionally along a first direction D1 and the second direction D2. In the example illustrated in FIGS. 12A to 12C, two hole portions 24 in the first direction D1 and two hole portions 24 in the second direction D2 are formed side by side.

Figure 13:
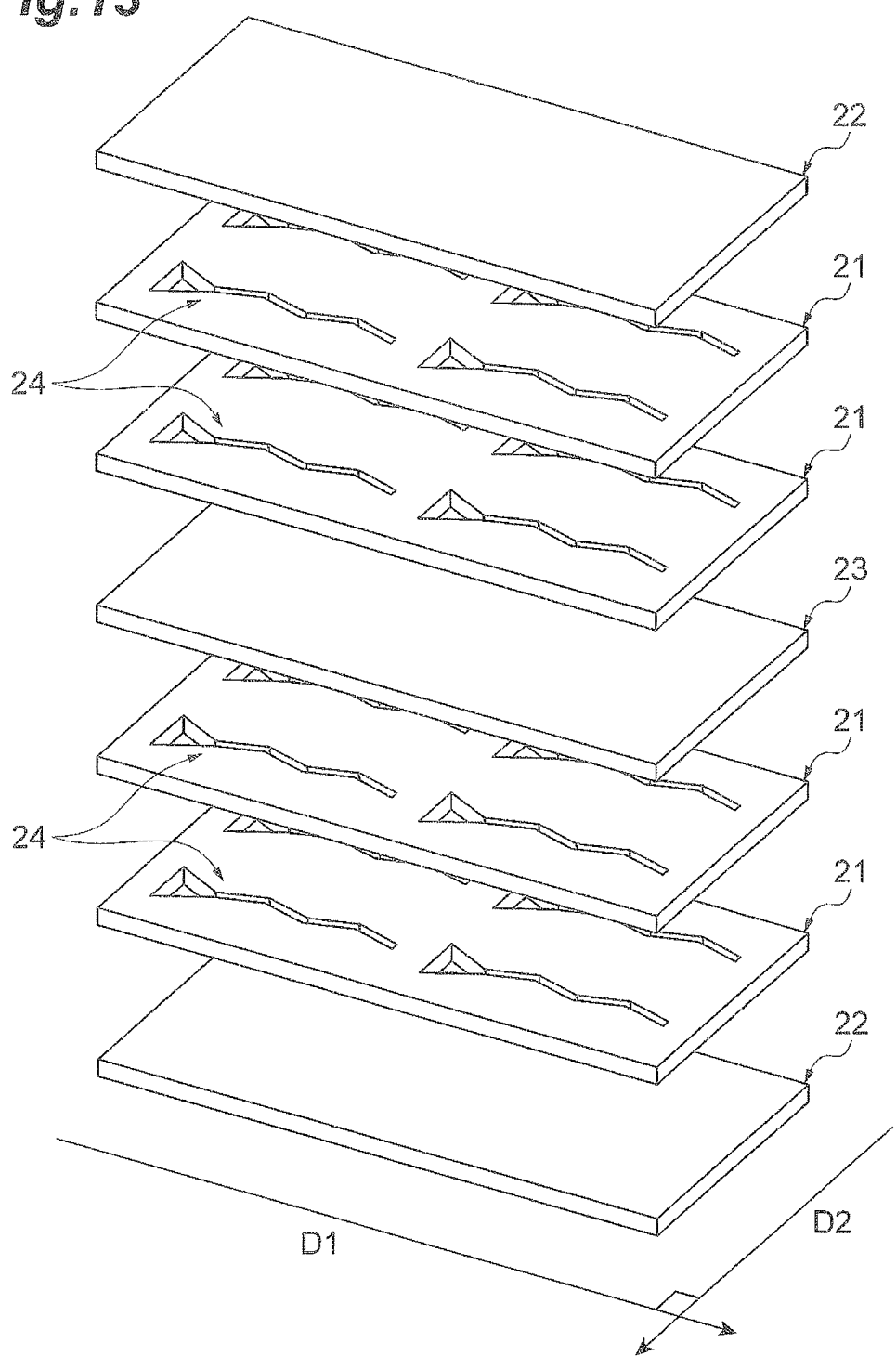
FIG. 13 is a view illustrating a step of the method of manufacturing an electron multiplier body according to the third modification example.

In a subsequent step, the first, second, and third plate-like members 21, 22, and 23 are laminated on each other so that the third plate-like member 23 is interposed between the first plate-like members 21 and the first plate-like members 21 are interposed between the pair of second plate-like members 22 to constitute the laminated body 27 (a laminating step), as illustrated in FIG. 13. That is, here, the second plate-like member 22, two of the first plate-like members 21, the third plate-like member 23, two of the first plate-like members 21, and the second plate-like member 22 are laminated in this order. By laminating the first, second, and third plate-like members 21, 22, and 23 on each other in this way, each channel 8 defined by the hole portions 24 are formed in the laminated body 27 in each of the first plate-like members 21 on both surfaces of the third plate-like member 23 (see FIG. 16).

Figure 14:
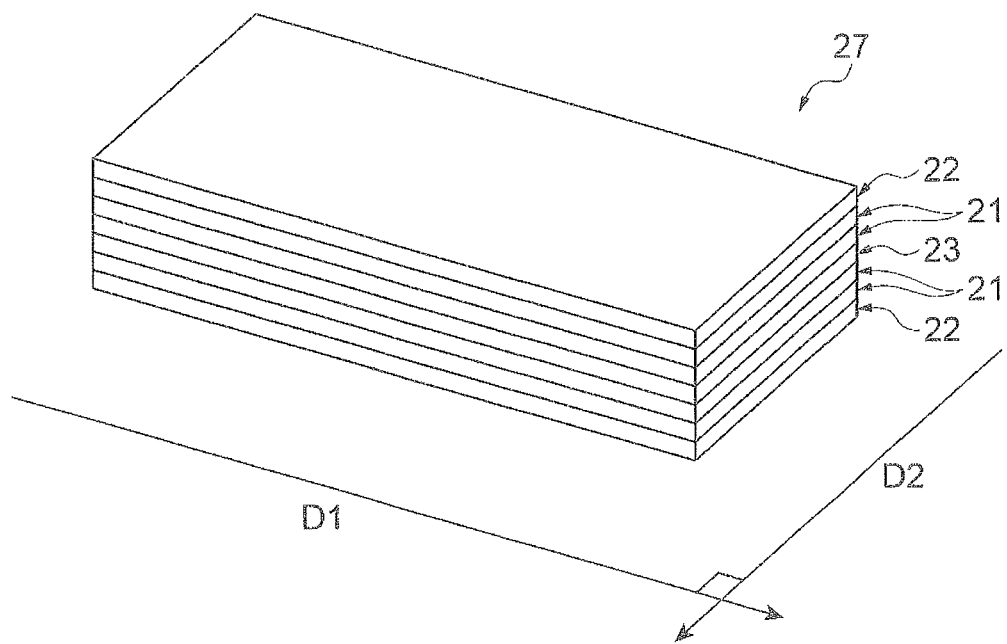
FIG. 14 is a view illustrating a step of the method of manufacturing an electron multiplier body according to the third modification example.

In a subsequent step, the laminated body 27 is integrated (an integrating step), as illustrated in FIG. 14.

Figure 15:
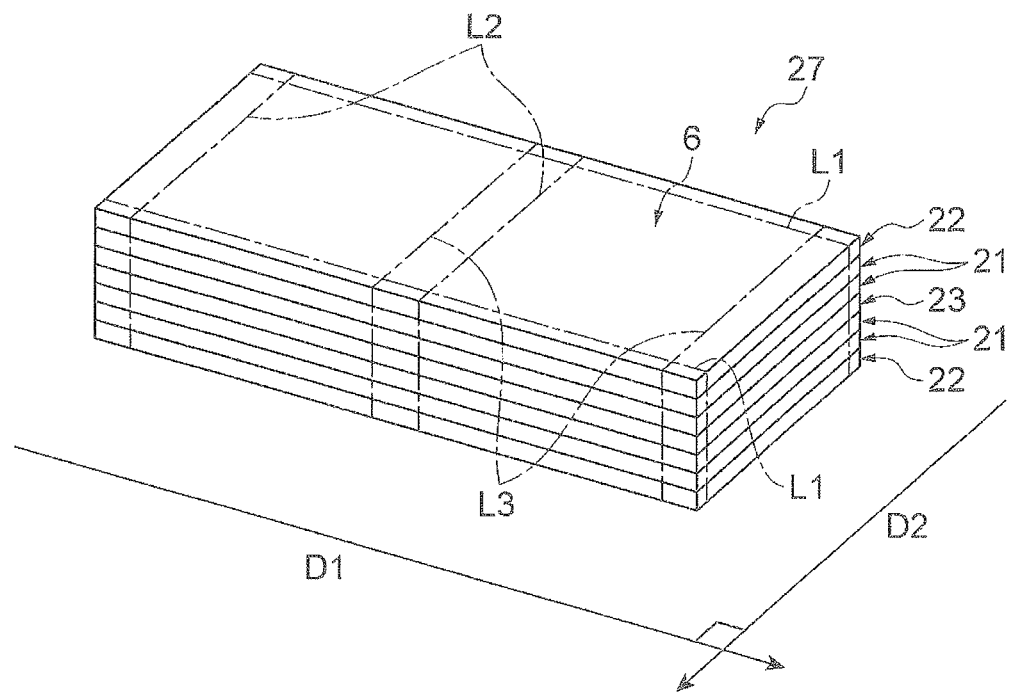
FIG. 15 is a view illustrating a step of the method of manufacturing an electron multiplier body according to the third modification example.
Figure 16:
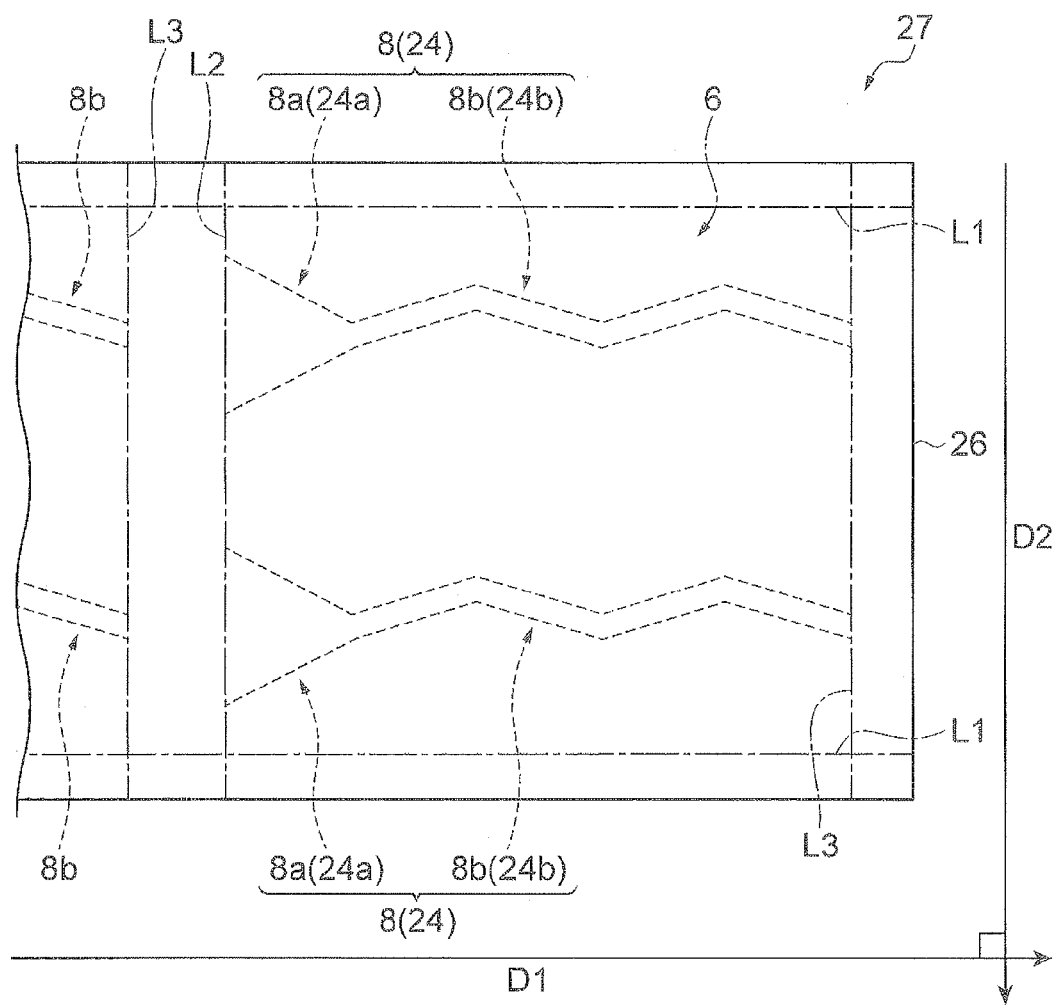
FIG. 16 is a view illustrating a step of the method of manufacturing an electron multiplier body according to the third modification example.

In a subsequent step, the integrated laminated body 27 is cut to constitute the main body portion 6 (a cutting step), as illustrated in FIGS. 15 and 16. In the cutting step, the laminated body 27 is cut along virtual cutting lines L1, L2, and L3 set in the laminated body 27. The cutting lines L1, L2, and L3 are set in a grid pattern so that channels 8 two-dimensionally arranged in the first direction D1 and the second direction D2 are carved plural by plural (here, two by two). The cutting line L1 is set along the first direction D1. The cutting line L1 is set to carve two channels 8 adjacent to each other in the second direction D2 as one set. Each of the cutting lines L2 and L3 are set along the second direction D2. The cutting line L2 is set so that the electron incidence portion 8a of each of the two channels 8 is open at a cut surface when cutting is performed along the cutting line L2. Further, the cutting line L3 is set so that the multiplier portion 8b of each of the two channels 8 is open at a cut surface when cutting is performed along the cutting line L3. By cutting the laminated body 27 along the cutting lines L1, L2, and L3 as described above, a plurality of main body portions 6 which each include the two channels 8 adjacent in the second direction D2 are constituted.

In a subsequent step, the resistive layer and the secondary electron multiplication layer are formed on the inner surface of the channel 8 formed in the main body portion 6 (a layer forming step). Through the above steps, the electron multiplier body 33 with multiple channels as illustrated in FIG. 11 is manufactured.

In the method of manufacturing the electron multiplier body 33, in the preparing step, the plurality of first plate-like members 21 are prepared and the third plate-like member 23 is further prepared, and in the laminating step, the first, second, and third plate-like members 21, 22, and 23 are laminated on each other so that the third plate-like member 23 is interposed between the first plate-like members 21 and the first and third plate-like members 21 and 23 are interposed between the pair of second plate-like members 22 to constitute the laminated body 27. Therefore, since the first plate-like members 21 are interposed between the third plate-like member 23 and the pair of second plate-like members 22, a plurality of channels 8 are constituted in the laminating direction thereof. Accordingly, it is possible to easily manufacture the electron multiplier body 33 with multiple channels.

Further, in the method of manufacturing the electron multiplier body 33, a plurality of hole portions 24 are formed in the first plate-like members 21 in the hole forming step. Therefore, the plurality of channels 8 are constituted in a direction along the surfaces 21a and the back surfaces 21b of the first plate-like members 21. Therefore, it is possible to easily manufacture the electron multiplier body 33 with multiple channels.

In the above embodiments, the method of manufacturing an electron multiplier body, the photomultiplier tube, and the photomultiplier according to an aspect of the present invention have been described. Accordingly, the method of manufacturing an electron multiplier body, a photomultiplier tube, and a photomultiplier according to an aspect of the present invention are not limited to those described above. The method of manufacturing an electron multiplier body, a photomultiplier tube, and a photomultiplier according to an aspect of the present invention described above may be arbitrarily changed without changing the gist of each claim.

For example, in the hole forming step, the hole portion 24 may be formed to reach the one end 25 or the other end 26 of the first plate-like member 21. In this case, before the cutting step, the hole portion 24 reaches any one among the one end 25 and the other end 26 of the first plate-like member 21. Therefore, in the cutting step, the channel 8 can be open at the one end surface 6a and the other end surface 6b of the main body portion 6 by simply cutting only the other of the one end 25 and the other end 26 of the first plate-like member 21. Further, before the cutting step, the hole portion 24 does not reach the other of the one end 25 and the other end 26 of the first plate-like member 21. Therefore, it is possible to prevent the first plate-like member 21 from being divided into two portions. Accordingly, it is possible to improve the workability. Further, it is possible to make the width of the channel 8 accurately and conveniently.

Further, as illustrated in FIG. 17, the electron multiplier body 2 may be a photomultiplier 35 using a photocathode 29 and an anode 30. The photocathode 29 exhibits substantially the same shape as a shape of the main body portion 6 of the electron multiplier body 2 when viewed from the first direction D1. Further, the photocathode 29 has a flat plate shape. The photocathode 29 is provided on the one end surface 6a to close the opening of the electron incidence portion 8a at one end surface 6a of the main body portion 6. Accordingly, photoelectrons generated at the photocathode 29 are supplied to the electron incidence portion 8a.

The anode 30 receives the secondary electrons emitted from the channel 8 according to the photoelectrons incident on the channel 8. The anode 30 is provided in the channel 8 to close the opening of the channel 8 at the other end surface 6b of the main body portion 6. Accordingly, the anode 30 receives the secondary electrons progressing in the channel 8 of the electron multiplier body 2 and reaching the other end surface 6b.

The photomultiplier 35 of this embodiment includes the above-described electron multiplier body 2. Therefore, it is possible to suitably achieve the operations and effects by the electron multiplier body 2.

Further, while the layer forming step is performed subsequent to the cutting step in the embodiments, the layer forming step may be performed subsequent to the laminating step, or may be performed subsequent to the integrating step.

Further, the first and second plate-like members 21 and 22 formed of a conductor such as metal may be used. In this case, after the cutting step and before the layer forming step, an insulating film forming step of forming an insulating film on the surface of the main body portion 6 and the inner surface of the channel 8 is further performed. In this case, since the conductor such as metal can be used as the first and second plate-like members 21 and 22, it is possible to manufacture the electron multiplier body 2 using a variety of materials.

What is claimed is:

1. A method of manufacturing an electron multiplier body including a main body portion extending in a first direction, and a channel opened at one end surface and the other end surface of the main body portion in the first direction and emits secondary electrons according to incident electrons, the method comprising:
   a preparing step of preparing a first plate-like member having a front surface and a back surface opposite to the front surface, and a pair of second plate-like members;
   a hole forming step of forming, in the first plate-like member, a hole portion reaching from the front surface to the back surface and extending along the front surface and the back surface;
   a laminating step of constituting a laminated body by laminating the first and second plate-like members on each other so that the first plate-like member is interposed between the pair of second plate-like members to form the channel defined by the hole portion in the laminated body;
   an integrating step of integrating the laminated body;
   a cutting step of constituting the main body portion by cutting the integrated laminated body; and
   a layer forming step of forming a resistive layer and a secondary electron multiplication layer on an inner surface of the channel,
   wherein in the cutting step, the laminated body is cut so that the channel is open at the one end surface and the other end surface.

2. The method of manufacturing an electron multiplier body according to claim 1,
   wherein in the layer forming step, the resistive layer and the secondary electron multiplication layer are formed using an atomic layer deposition method.

3. The method of manufacturing an electron multiplier body according to claim 1,
   wherein the first and second plate-like members are formed of a conductor,
   the method further comprises an insulating film forming step of forming an insulating film on a surface of the main body portion and the inner surface of the channel before the layer forming step.

4. The method of manufacturing an electron multiplier body according to claim 1,
   wherein in the hole forming step, the hole portion is formed to reach one end or the other end of the first plate-like member in the first direction.

5. The method of manufacturing an electron multiplier body according to claim 1,
   wherein in the hole forming step, the hole portion is formed not to reach end portions of the first plate-like member.

6. The method of manufacturing an electron multiplier body according to claim 1,
   wherein a thickness of the first and second plate-like members is 5 mm or less.

7. The method of manufacturing an electron multiplier body according to claim 1,
   wherein in the preparing step, a plurality of the first plate-like members are prepared, and a third plate-like member is further prepared,
   in the laminating step, the first, second, and third plate-like members are laminated on each other so that the third plate-like member is interposed between the first plate-like members and the first and third plate-like members are interposed between the pair of second plate-like members to constitute the laminated body.

8. The method of manufacturing an electron multiplier body according to claim 1,
   wherein in the hole forming step, a plurality of the hole portions are formed in the first plate-like member.

9. A photomultiplier tube comprising:
   the electron multiplier body manufactured using the method of manufacturing an electron multiplier body according to claim 1;
   a tube body accommodating the electron multiplier body;
   a photocathode provided in the tube body to face an opening of the channel in the one end surface and configured to supply photoelectrons to the channel; and
   an anode arranged in the tube body to face an opening of the channel in the other end surface and configured to receive secondary electrons emitted from the channel according to the photoelectrons incident on the channel.

10. A photomultiplier comprising:

the electron multiplier body manufactured using the method of manufacturing an electron multiplier body according to claim 1;

a photocathode provided to close an opening of the channel at the one end surface and configured to supply photoelectrons to the channel; and an anode provided to close an opening of the channel in the other end surface and configured to receive secondary electrons emitted from the channel according to the photoelectrons incident on the channel.

11. The method of manufacturing an electron multiplier body according to claim 1, wherein in the layer forming step, the resistive layer and the secondary electron multiplication layer are formed using an atomic layer deposition method, in the preparing step, a plurality of the first plate-like members are prepared, and a third plate-like member is further prepared, in the laminating step, the first, second, and third plate-like members are laminated on each other so that the third plate-like member is interposed between the first plate-like members and the first and third plate-like members are interposed between the pair of second plate-like members to constitute the laminated body.

12. The method of manufacturing an electron multiplier body according to claim 1, wherein in the layer forming step, the resistive layer and the secondary electron multiplication layer are formed using an atomic layer deposition method, in the hole forming step, a plurality of the hole portions are formed in the first plate-like member.

13. The method of manufacturing an electron multiplier body according to claim 1, wherein the first and second plate-like members are formed of a ceramic.

* * * * *